United States Patent [19]

Igarashi et al.

[11] Patent Number: 5,708,372
[45] Date of Patent: Jan. 13, 1998

[54] SEMICONDUCTOR DEVICE WITH ELECTROMAGNETIC RADIATION REDUCED

[75] Inventors: Hatsuhide Igarashi; Shigeru Takayama; Yoshihiro Matsuura, all of Tokyo; Hatsuhiro Nagaishi, Kanagawa, all of Japan

[73] Assignee: NEC Corporation, Tokyo, Japan

[21] Appl. No.: 658,411

[22] Filed: Jun. 5, 1996

[30] Foreign Application Priority Data

Jun. 22, 1995 [JP] Japan ................ 6-155824

[51] Int. Cl.$^6$ ................................ H03K 17/16
[52] U.S. Cl. .............. 326/27; 326/28; 326/101
[58] Field of Search ............. 326/21, 26, 27–28, 326/101, 93; 361/91

[56] References Cited

U.S. PATENT DOCUMENTS

| | | | |
|---|---|---|---|
| 4,656,370 | 4/1987 | Kanuma | 326/26 |
| 4,857,765 | 8/1989 | Cahill et al. | 326/26 |
| 5,148,048 | 9/1992 | Kawasaki et al. | 328/26 X |
| 5,153,457 | 10/1992 | Martin et al. | 326/27 X |
| 5,168,181 | 12/1992 | Baiocchi et al. | 326/26 |
| 5,223,745 | 6/1993 | Ohannes et al. | 326/27 X |
| 5,319,260 | 6/1994 | Wanlass | 326/26 |
| 5,570,046 | 10/1996 | Sharpe-Geisler | 326/26 X |

FOREIGN PATENT DOCUMENTS

| | | |
|---|---|---|
| 000509489 | 10/1992 | European Pat. Off. ......... 326/27 |
| 61-264747 | 11/1986 | Japan . |
| 194646 | 4/1989 | Japan . |
| 1177630 | 7/1989 | Japan . |
| 2111063 | 4/1990 | Japan . |
| 393261 | 4/1991 | Japan . |
| 437059 | 2/1992 | Japan . |
| 4361567 | 12/1992 | Japan . |

*Primary Examiner*—David R. Hudspeth
*Attorney, Agent, or Firm*—Whitham, Curtis, Whitham & McGinn

[57] ABSTRACT

In a semiconductor device in which power is supplied from an external power supply system, a first power supply system is connected to first terminals of power supply and ground and a digital inner circuit. The inner circuit includes a clock signal generating circuit, a driver for the clock signal, and circuits operating in response to the clock signal. A second power supply system is connected to second terminals of power supply and ground, the input terminal, the output terminal, and a digital interface circuit. The second power supply system is independent of the first power supply system. The interface circuit includes a MOS transistor for pulling up or down the input terminal and an output circuit which includes a MOS transistor driving an output terminal. The first power supply system is separated from the second power supply system, and the inner circuit is connected to the interface circuit through only signal lines.

12 Claims, 7 Drawing Sheets

SEMICONDUCTOR DEVICE WITH ELECTROMAGNETIC RADIATION REDUCED

BACKGROUND OF THE INVENTION

1. Field of the Invention

The present invention relates to a semiconductor device, and more particularly to a semiconductor device in which a digital circuit using a periodic pulse signal is built.

2. Description of Related Art

Conventionally, such a type of semiconductor device is widely used for the control use of various products at present. For example, FIG. 1 is a diagram illustrating an example of arrangement of the wirings of power supply and ground in a semiconductor device which is disclosed in Japanese Laid Open Patent Disclosure (JP-A-Sho61-264747).

Referring to FIG. 1, the conventional semiconductor device is constituted by dividing the wirings of power supply and ground in a chip into the following two sets. One set is composed of a power supply terminal 101 and wiring 111 for an input circuit and inner circuit 108, and a ground terminal 102 and wiring 112 for the input circuit and inner circuit 108. The other set is composed of a power supply terminal 103 and wiring 113 for an output circuit 109, and a ground terminal 104 and wiring 114 for the output circuit 109. A terminal 105 is the output terminal of the output circuit 109 which is connected to the wiring 113 and 114 of power supply and ground for the output circuit 109 and a terminal 106 is the input terminal of the input circuit 108 which connected to wiring 111 and 112 of power supply and ground for the inner circuit and input circuit 108.

Next, the operation of the conventional semiconductor device will be briefly described. Large current flows when the output signal of the output terminal 105 changes and potentials of the wirings 113 and 114 of power supply and ground greatly fluctuate in the chip. However, because the input circuit and inner circuit 108 receive the supply of power from the terminals 101 and 102 using another wirings 111 and 112, they are not influenced by the change of power supply voltage due to the change of output signal. Thereby, the input level change and erroneous operation of the inner circuit 108 can be prevented from being caused by change of power supply voltage of the output circuit 109.

Generally, when a digital circuit switches on/off, power supply current flows in accordance with the switching. FIG. 2A is a diagram showing the waveform of a periodic pulse signal and FIG. 2B is a diagram showing the power supply current of a CMOS digital circuit which operates in response to the periodic pulse signal. As seen from the figures, the power supply current periodically changing radiates electromagnetic wave including a lot of harmonic waves and the signal strength is also strong. In a case where the electromagnetic waves are introduced in a tuner for example, the deadlock of an automatic tuning system would be caused. Thus, the electromagnetic wave radiation is one cause of erroneous operation of apparatuses.

The source of generation of the harmonic waves is the inner circuit of the chip. Specifically, in a case of microcomputer, because it operates in synchronous with the clock signal, the noise level is greater. On the other hand, noise is also generated when the output circuit is switched on or off. Although the noise is not small, the noise is continuous spectrum having a small amplitude, whereas, the harmonic wave noise is a line spectrum having a large amplitude. Therefore, the influence of the noise due to the switching of the output circuit is less with respect to the radiation of harmonic wave noise.

As seen from the above, it is important to separate the wirings of power supply and ground of the inner circuit 108 from the wirings of power supply and ground of the output circuit 108. Especially, when outputting a high/low level, the output circuit outputs the power supply or ground level just as it is. At that time, if spectrum noise is superposed on the wirings of power supply and ground and the terminal, electromagnetic waves are radiated from many terminals of the microcomputer.

By the way, pulling up or down in the input circuit functions as the same cause. Especially, because the input circuit is connected to the wirings of power supply and ground of the inner circuit which generates the spectrum noise, there is a problem in that noise is radiated via the pulling-up/pulling down circuit.

SUMMARY OF THE INVENTION

Therefore, an object of the present invention is to provide a semiconductor device in which periodic spectrum harmonic wave radiated from the semiconductor device can be reduced.

In order to achieve an aspect of the present invention, a semiconductor device in which power is supplied from an external power supply system, includes an input terminal, an output terminal, a first power supply system connected to first terminals of power supply and ground and a digital inner circuit, wherein the inner circuit includes a clock signal generating circuit, a driver for the clock signal, and circuits operating in response to the clock signal, and a second power supply system connected to second terminals of power supply and ground, the input terminal, the output terminal, and a digital interface circuit, wherein the second power supply system is independent of the first power supply system, and wherein the interface circuit includes a MOS transistor for pulling up or down the input terminal and an output circuit which includes a MOS transistor driving the output terminal, wherein the first power supply system is separated from the second power supply system, and the inner circuit is connected to the interface circuit through only signal lines. An input circuit may be connected to the first power supply system or the second power supply system.

The semiconductor device may further include an analog circuit connected to a third power supply system which is connected to the second power supply system. In this case, the analog circuit preferably includes a circuit for inhibiting the inner circuit from driving the interface circuit during operation of the analog circuit. In the semiconductor device, it is preferable that the second power supply system includes a third power supply system connected to the second terminals, the output circuit and said output terminal, and a fourth power supply system connected to the third power supply system, the input circuit and said input terminal. In this case, the MOS transistor for pulling up or down the input terminal is connected to the third power supply system.

The semiconductor device may further comprising low pass filters connected between the first terminals and the external power supply system, so that electromagnetic wave radiation can be further prevented. If the semiconductor device includes electrostatic break down protecting elements disposed between the first power supply system power supply terminal and the second power supply system power supply terminal, between the first power supply system power supply terminal and the second power supply system ground terminal, between the first power supply system ground terminal and the second power supply system power supply terminal, between the first power supply system ground terminal and the second power supply system ground terminal, between external power supply line and the input terminal, between external ground line and the input terminal, between external power supply line and the output terminal, and between external ground line and the output terminal, respectively, the semiconductor device can be protected from electrostatic break down.

BRIEF DESCRIPTION OF THE DRAWINGS

FIG. 3 is an arrangement diagram showing the semiconductor device according to the first embodiment of the present invention;

FIG. 4 is a circuit diagram showing an example of signal transfer between two power supply systems in the semiconductor device of FIG. 1;

DESCRIPTION OF THE PREFERRED EMBODIMENTS

Figure 1:
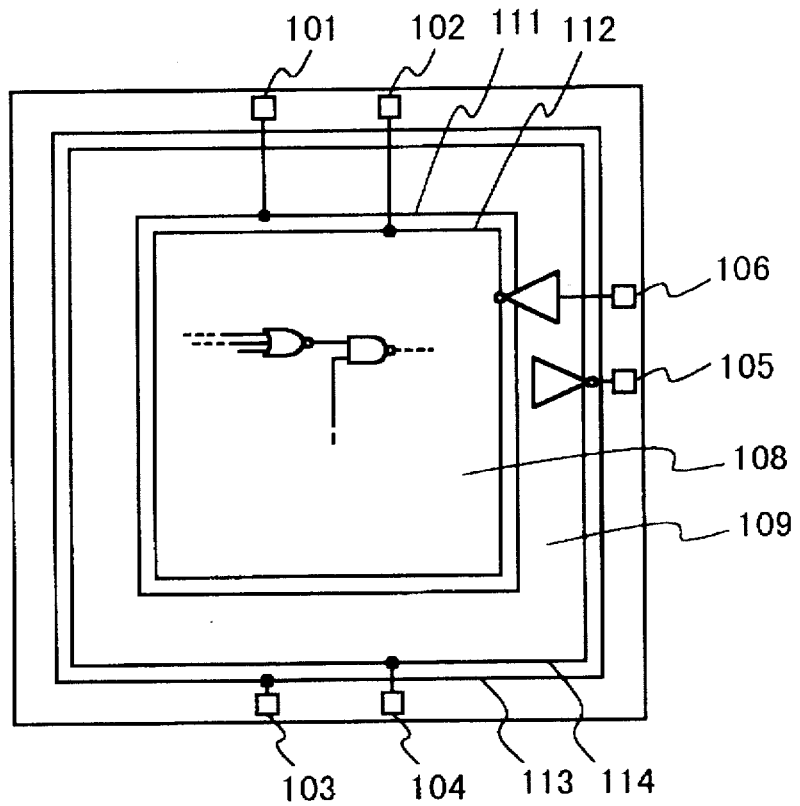
FIG. 1 is an arrangement diagram showing an example of conventional semiconductor device.
Figure 2:
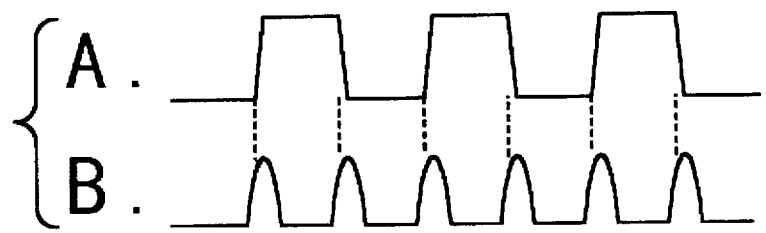
FIGS. 2A and 2B are waveforms of a periodic pulse signal and power supply current in a CMOS digital circuit operating in response to the periodic pulse signal, respectively.

The semiconductor device of the present invention will be described with reference to the drawings.

FIG. 3 is an arrangement diagram showing the semiconductor device according to the first embodiment of the present invention. FIG. 4 is a circuit diagram which shows an example of signal transfer among two power supply systems of the semiconductor device of this embodiment. Referring to FIGS. 3 and 4, the semiconductor device of this embodiment is constituted by dividing the wirings of power supply and ground in a chip into the following two sets. One set is constituted of a power supply terminal 1 and wiring 11 for an inner circuit 8, the ground terminal 2 and wiring 12 for the inner circuit 8. The other set is constituted of the power supply terminal 3 and wiring 13 for an interface circuit 9 and a ground terminal 4 and wiring 14 for the interface circuit 9. The interface circuit 9 is composed of load means for pulling up or the pulling down an input terminal 6 and an output circuit which includes drive means for driving an output terminal 5. The terminal 5 is the output terminal of the output circuit connected to the power supply wiring 13 and the ground wiring 14 for the interface circuit 9. The terminal 6 is the input terminal of the input circuit connected to the power supply wiring 13 and the ground wiring 14 for the interface circuit 9 in the embodiment. In the embodiment, the input terminal 6 is pulled-up by a MOS transistor 7, as shown in FIG. 3. That is, the source and drain of the MOS transistor 7 are connected to the power supply wiring 13 and the input terminal 6. However, the gate is connected to the inner circuit 8 in the embodiment. The gate may be connected to the interface circuit 9. Here, the inner circuit 8 means a circuit including a circuit for generating or outputting a clock signal, a clock signal driver, a circuit operating in response to the clock signal. The inner circuit 8 does not include a circuit for supplying any DC level to the terminals 5 and 6, such as a MOS transistor which drives the output terminal 5 and the MOS transistor 7 which pulls up or down the input terminal 6. Also, the interface circuit 9 means a circuit for supplying any DC level to the terminals 5 and 6 from the side of the IC, such as the MOS transistor for driving the output terminal 5 and the MOS transistor for pulling up/pulling down the input terminal 6. The interface circuit 9 does not includes a circuit which generates the clock signal, the clock signal driver, and the circuit operating in response to the clock signal, unlike the inner circuit.

Next, the operation of the semiconductor device having such a structure will be explained. In a digital circuit, as described above, there are a periodic wave which is represented by the clock signal and a pulse which is near a single waveform not to have a constant frequency such as data and various request signals. Among these signals, the periodic wave radiates strong harmonic waves. Therefore, it is desirable to collect circuits each having a large rate to handle this periodic wave signal as the inner circuit 8 and to separate a power supply system for the inner circuit 8 from a power supply system of the interface circuit 9 which includes load means for pulling up or down the input terminal and the output circuit which includes the drive means for driving the output terminal. As a result, it can be prevented that harmonic wave noise generated in the inner circuit 8 is irradiated from not only the output terminal 5 but also the pulled up/down input terminal 6 to the outside of the semiconductor device. Also, noise radiation can be limited to the radiation from the power supply system of the inner circuit 8.

Referring to FIG. 4, wirings for signal transfer are disposed only between a power supply system VDD1 and GND1 for the inner circuit 8 and a power supply system VDD2 and GND2 for the interface circuit 9. Thus, the signal transfer between the inner circuit 8 and the interface circuit 9 is performed by outputting a signal from one circuit of them to the gate electrode of a MOS transistor of the other circuit. This is because there is the possibility that in a case of using a transfer gate, for example, the PN junction between a well and a source/drain of a transfer gate is biased in a forward direction so that latch-up occurs, when a potential difference is caused between the two power supply systems. It should be noted that an input circuit 31 connected to the input terminal 6 is provided in the interface circuit in FIG. 4. However, the input circuit 31 may be provided in the inner circuit 8 such that the input circuit 31 is connected to the wirings 11 and 12 of power supply and ground for the inner circuit 8.

Figure 5:
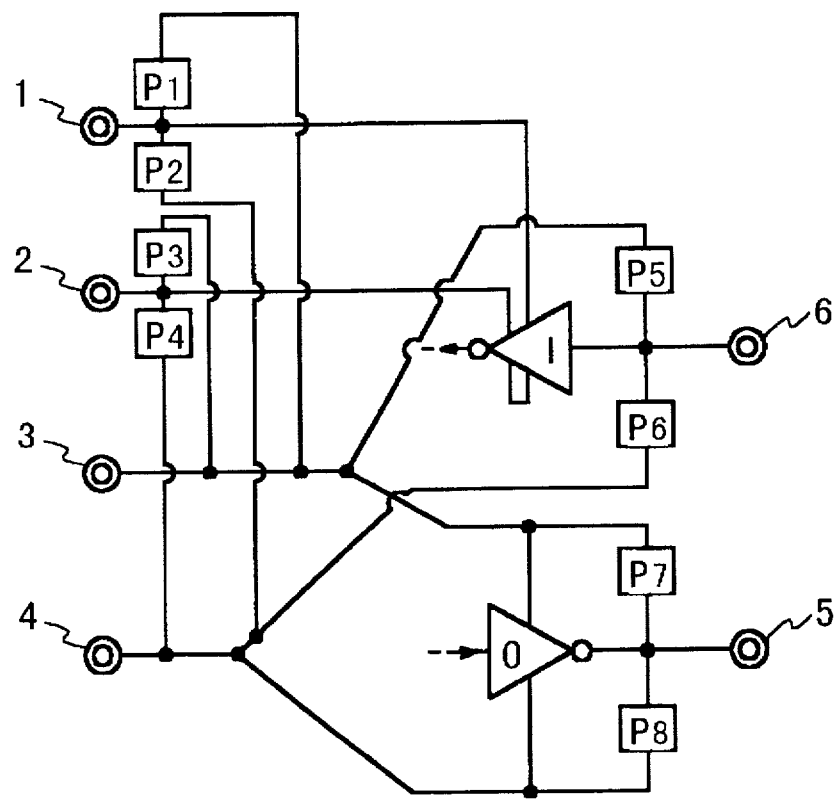
FIG. 5 is a circuit diagram showing an example of electrostatic break down protection measure of the semiconductor device of FIG. 1.

FIG. 5 is a circuit diagram which shows an example of electrostatic break down protecting measure suitable for the semiconductor device of this embodiment. Referring to FIG. 5, the semiconductor device is composed of the electrostatic break down protecting elements P1 to P8. The electrostatic break down protecting elements P1 is disposed between the power supply terminal 1 and the power supply terminal 3, the electrostatic break down protecting elements P2 is disposed between the power supply terminal 1 and the ground terminal 4. The electrostatic break down protecting elements P13 is disposed between the ground terminal 2 and the power supply terminal 3, and the electrostatic break down protecting elements P4 is disposed between the ground terminal 2 and the ground terminal 4. In addition, the electrostatic break down protecting elements P5 is disposed between power supply terminal 3 possibly connected to external power supply line and the input terminal 6, and the electrostatic break down protecting elements P6 is disposed between the ground terminal 4 possibly connected to external ground line and the input terminal 6. Also, the electrostatic break down protecting elements P7 is disposed between power supply terminal 3 and the output terminal 5, and the electrostatic break down protecting elements P8 is disposed between the ground terminal 4 and the output terminal 5.

Thus, by separating the power supply systems, the degradation of the electrostatic break down voltage and latch-up endurance can be prevented. As these electrostatic break down protection elements P1 to P8, generally, P- and N-channel transistors are used.

Figure 6:
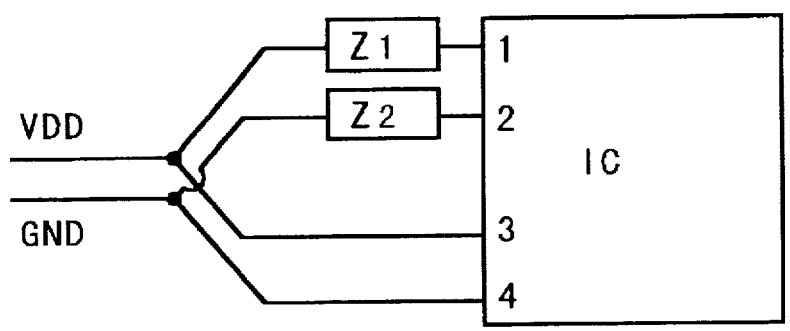
FIG. 6 is a block diagram showing an example in which a board is mounted of the semiconductor device of FIG. 1.
Figure 5:
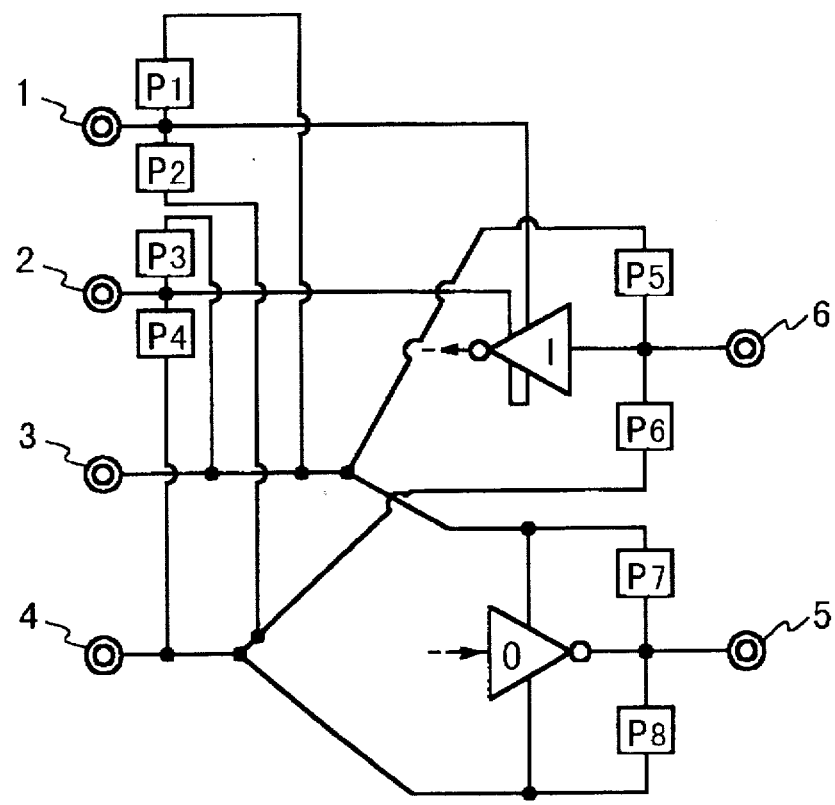
Figure 6:
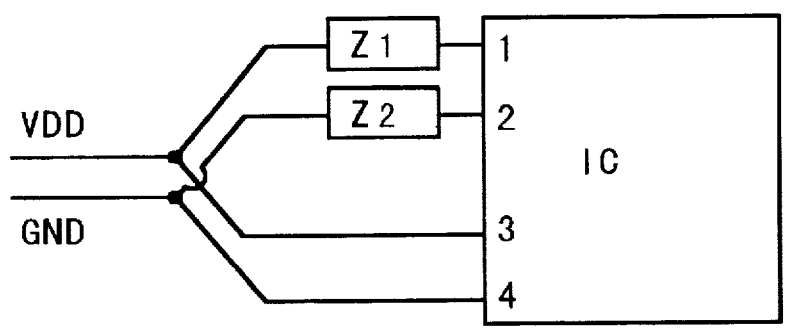

FIG. 6 is a block diagram which shows an example when the semiconductor device of this embodiment is mounted on a board. Referring to FIG. 6, low pass filter elements Z1 and Z2 are inserted between the power supply terminal 1 and the external power supply line VDD and between the ground terminal 2 and the external ground line GND. The power supply terminal 3 and ground terminal 4 which are connected to the output circuit 9 are directly connected to the external power supply line VDD and external ground line GND. Because changes of the number of the output and the drive current is remarkable, low pass filter elements cannot be inserted between the external power supply line and the power supply terminal 3 and between external ground line and the ground terminal 4. However, the power supply terminal 1 and ground terminal 2 which are connected to the inner circuit 8 do not change greatly. Therefore, they change only in a HALT or standby state. In this case, however, there is no problem in practical use because the operation is stopped. In this case, if there is disposed a bypass capacitor between the power supply line VDD and the ground line GND of the board, the effect is further increased.

Figure 7:
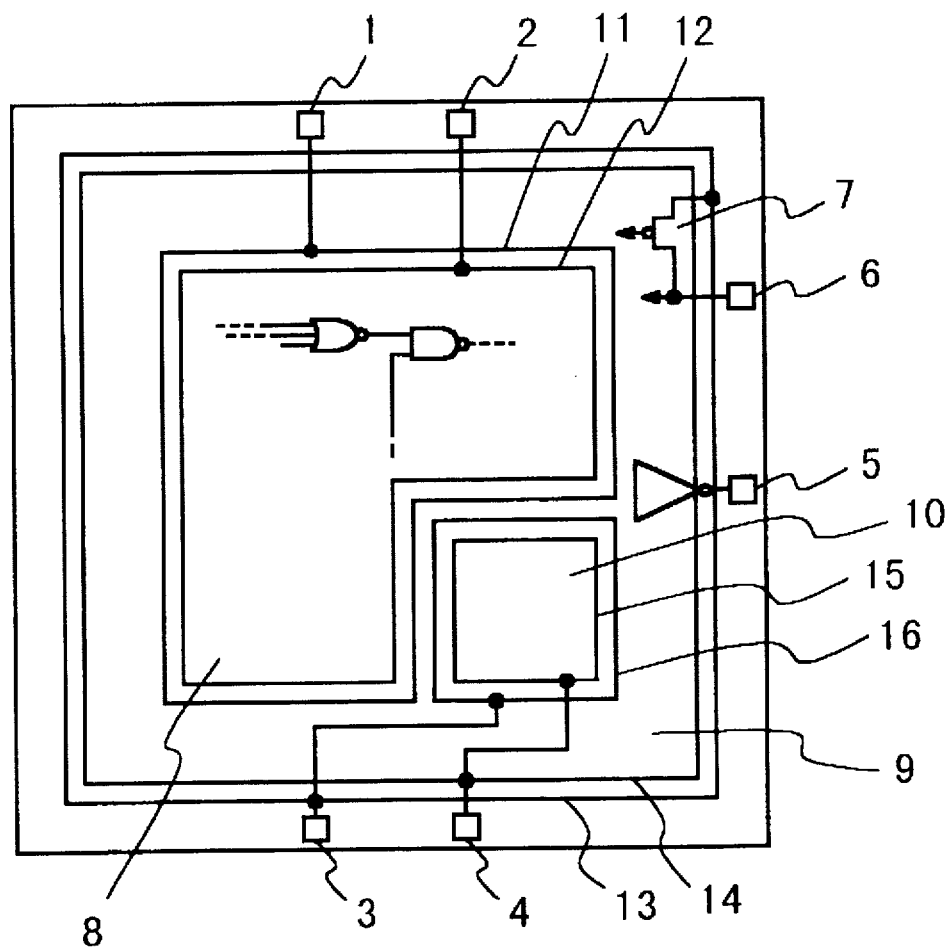
FIG. 7 is an arrangement diagram showing the semiconductor device according to the second embodiment of the present invention.
Figure 8:
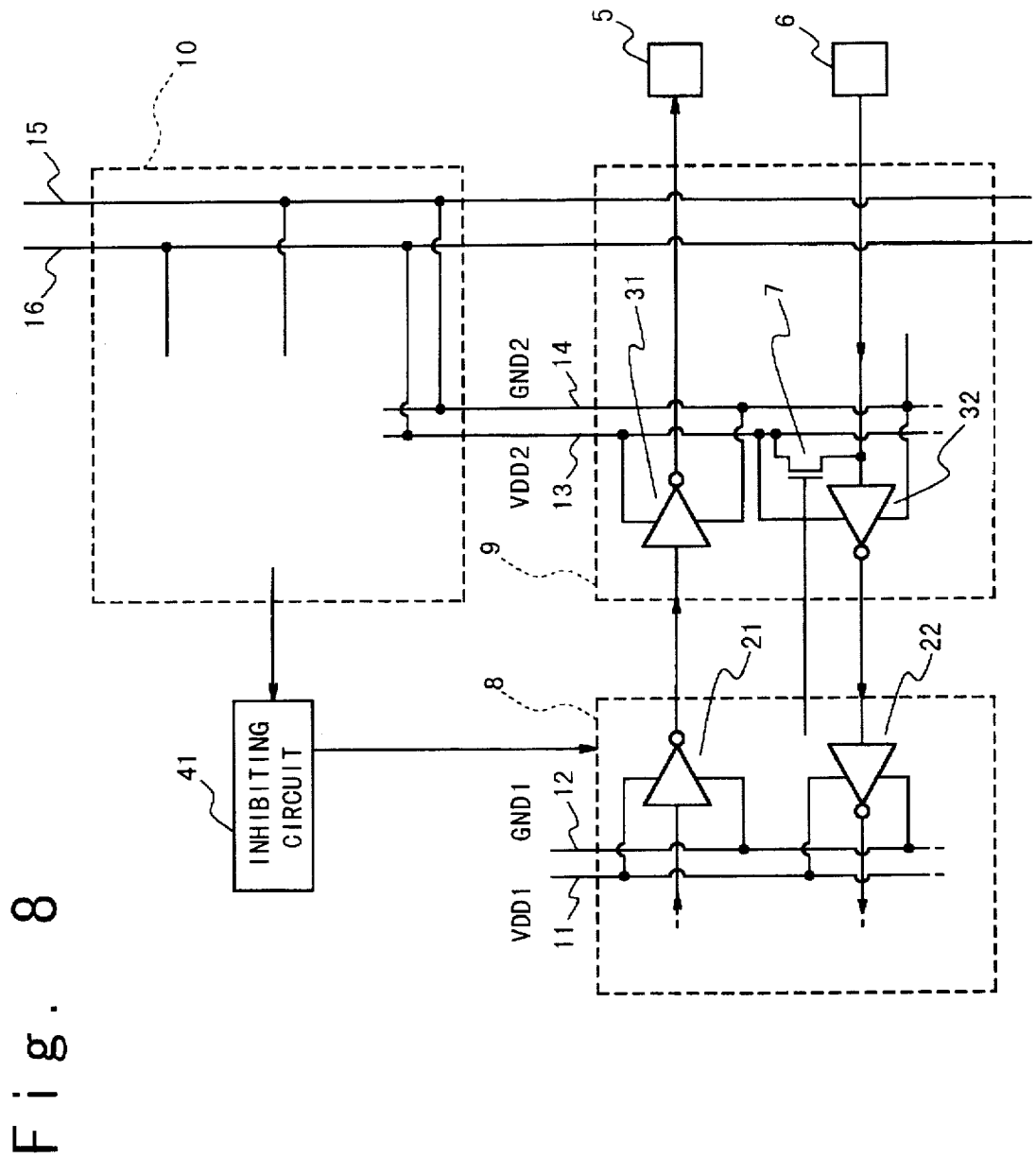
FIG. 8 is a circuit diagram showing the circuit connection within the semiconductor device according to the second embodiment of the present invention.

FIG. 7 is a diagram showing the arrangement of the semiconductor device according to the second embodiment of the present invention. FIG. 8 is a circuit diagram showing the circuit structure of the semiconductor device of this embodiment. Referring to the FIG. 7, in the semiconductor device of the second embodiment, wirings 15 and 16 of power supply and ground of an analog circuit 10 are added to the wirings 11, 12, 13 and 14 of power supply and ground in the structure of the FIG. 1. The wirings 15 and 16 of power supply and ground of the analog circuit 10 are connected to the wirings 13 and 14, respectively. In the embodiment, the internal structure is composed of the following two sets. That is, one set is composed of the power supply terminal 1 and wiring 2 for the inner circuit 8 and the ground terminal 2 and wiring 12 for the inner circuit 8. The other set is composed of the power supply terminal 3 and wiring 13 for the interface circuit 9, the ground terminal 4 and wiring 14 for the interface circuit 9, and the wirings 15 and 16 of power supply and ground for the analog circuit 10. The interface circuit 9 includes an output circuit which includes drive means for driving the output terminal 5, and load means for pulling up or down the input terminal 6. The terminal 5 is the output terminal of the interface circuit which is connected to the wirings 13 and 14 of power supply and ground for the interface circuit 9. The terminal 6 is the input terminal of an input circuit which may be connected to the wirings 13 and 14 of power supply and ground or the wirings 11 and 12 of power supply and ground. In the second embodiment, the interface circuit with the pull-up MOS transistor 7 as load means is showed. The source/drain of the MOS transistor 7 is connected to the power supply wiring 13 and the input terminal 6, respectively. The gate of the MOS transistor 7 is connected to the inner circuit 8 in the embodiment. However, the gate may be connected to the interface circuit 9.

The analog circuit 10 is easily influenced by not only noise generated when the interface circuit 9 switches but also the operation of the inner circuit 8. Generally, the analog circuit 10 is provided with another independent power supply system. However, there is a case where more than one power supply systems exist already as in the embodiment. In such a case, the number of terminals of the IC is limited so that the practical use of the IC is possibly limited, if the other power supply system is required. For this reason, as shown in Japanese Laid Open Patent Disclosure (JP-A-Heil-177630), by the way of using to stop the I/O function during the analog operation by an inhibiting circuit 41 as shown in FIG. 8, the analog circuit 10 is protected from influence of the operation of the inner circuit 8. Also, the terminals for the new other power supply system are also not required.

Figure 9:
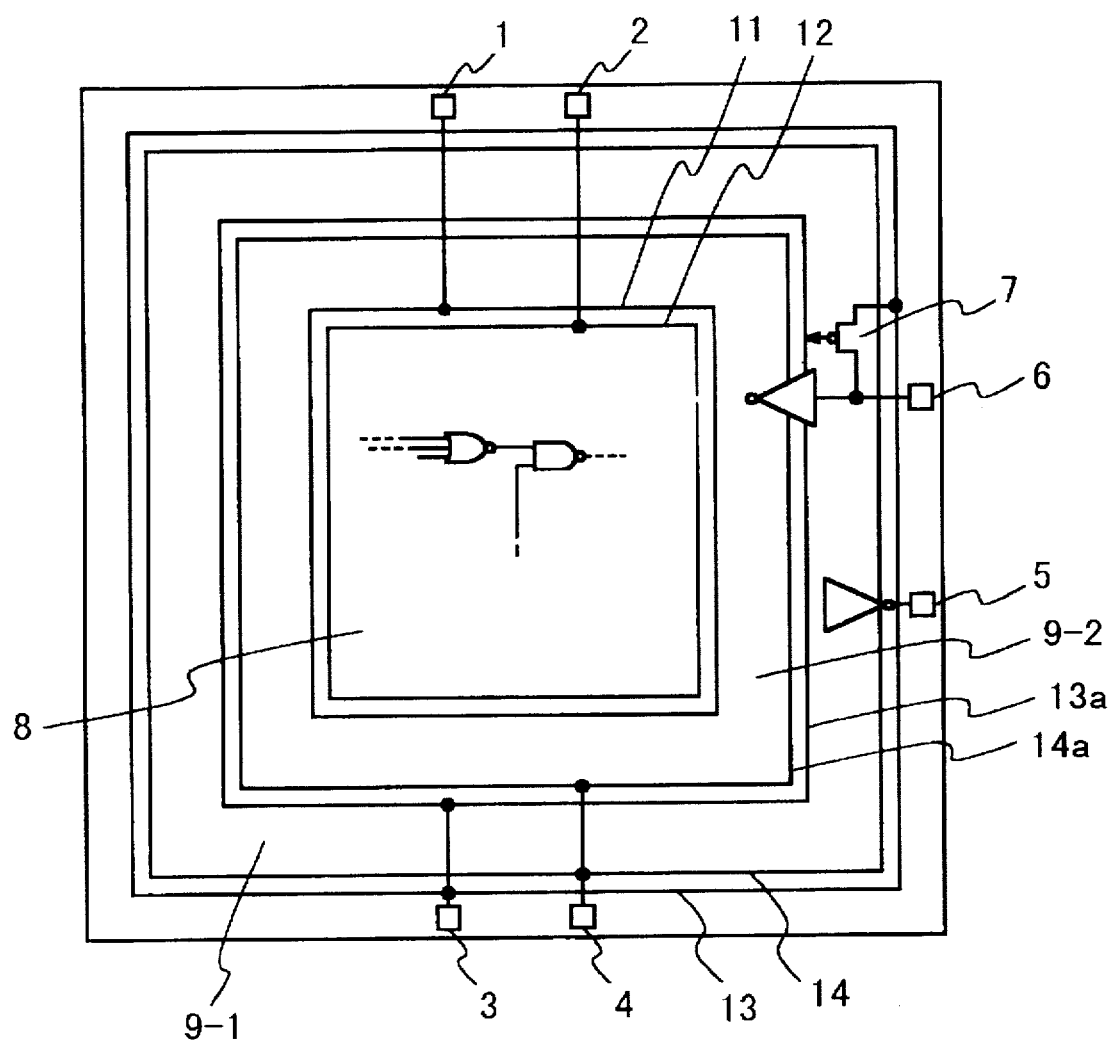
FIG. 9 is an arrangement diagram showing the semiconductor device according to the third embodiment of the present invention.
Figure 10:
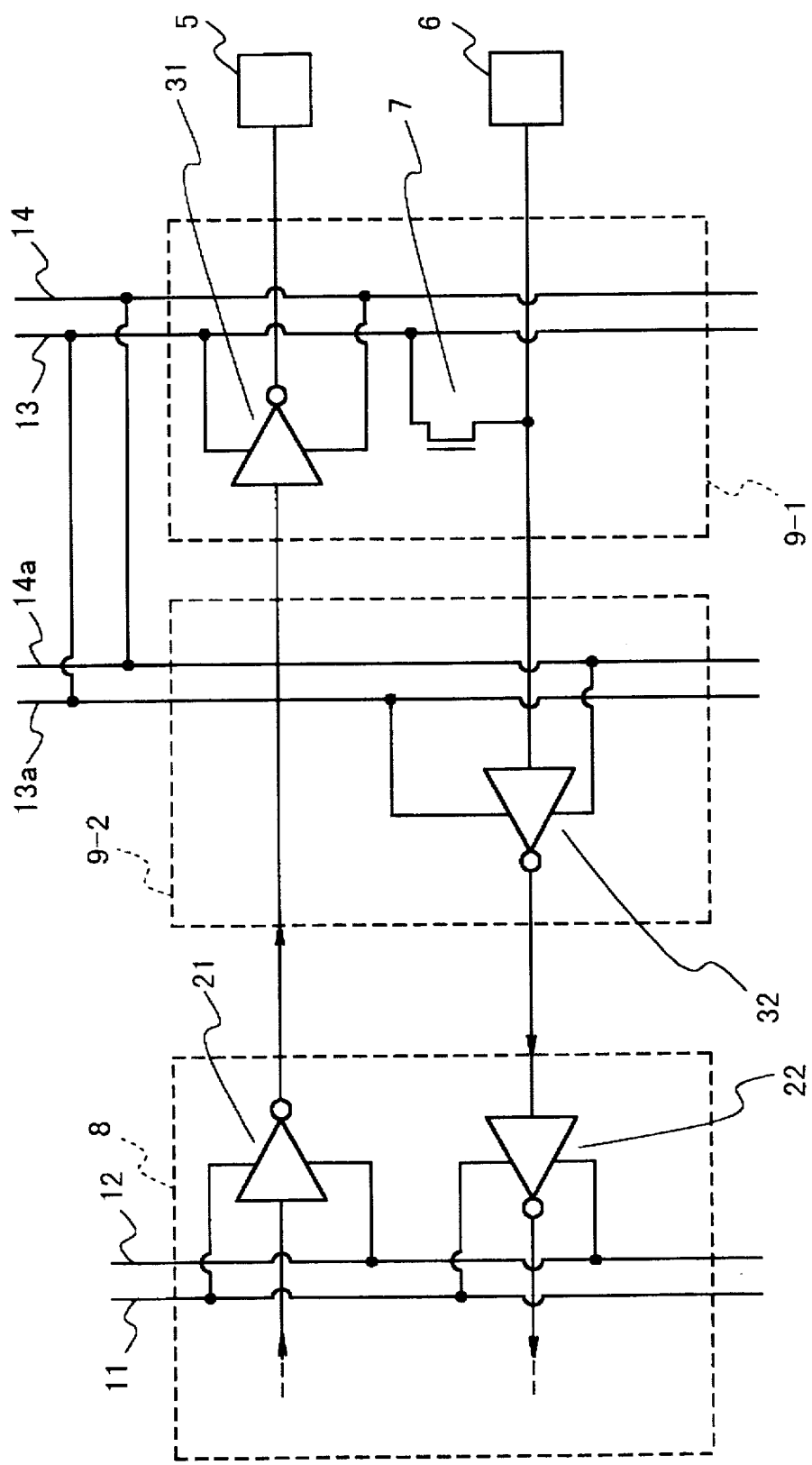
FIG. 10 is a circuit diagram showing the circuit connection within the semiconductor device according to the second embodiment of the present invention.

FIG. 9 is an arrangement diagram which shows the semiconductor device according to the embodiment of the present invention. FIG. 10 is a circuit diagram showing the circuit structure of the semiconductor device of the third embodiment. Referring to the FIG. 9, in the semiconductor device of the third embodiment, the interface circuit 9 of FIG. 3 is separated into an input circuit 9-2 which inputs the signal from the input terminal 6, and an output circuit 9-1 for outputting the signal to the output terminal 5. The output circuit 9-1 is included in the interface circuit. The wirings 13a and 14a of power supply and ground are for the input circuit 9-2 and the wirings 13 and 14 of power supply and ground are for the output circuit 9-1. Thus, the wirings of power supply and ground in the chip are divided and composed of the following three sets. More particularly, the first set is composed of the power supply terminal 1 and wiring 11 for the inner circuit 8, and the ground terminal 2 and wiring 12 for the inner circuit 8. The second set is composed of the power supply terminal 3 and wiring 13 for the output circuit 9-1, and the ground terminal 4 and wiring 14 for the output circuit 9-1. The third set is composed of the wirings 13a and 14a of power supply and ground for the input circuit 9-2, and connected to the wirings of power supply and ground for the output circuit 9-2, respectively. The interface circuit includes load means for pulling up or down the input terminal 6 and the output circuit 9-1 which includes drive means for driving the output terminal 5. The terminal 5 is the output terminal of the output circuit 9-1 which is connected to the wirings 13 and 14 of power supply and ground. The terminal 6 is the input terminal of the input circuit 9-2 which is connected to the wirings 13a and 14a of power supply and ground. In the present embodiment, the interface circuit with the pull up MOS transistor as load means is shown. The source/drain of the MOS transistor 7 are connected to the input terminal 6 and the power supply wiring 13.

As described above, it is the inner circuit 8 including a clock generating circuit that generates periodic spectrum noise. This is caused by change of the power supply current. Since the load of gate circuits in the semiconductor device is not changed as far as there is not a problem in practical use, the power supply current changes slowly if the power supply voltage is decreased, resulting in the spectrum noise decreased. In this case, if the power supply voltage of the whole semiconductor device is decreased, there would be caused a problem of interface with the external circuit. For example, if only the power supply voltage for the inner circuit 8 is decreased, the fatal problem of the interface would not be possibly caused. However, if the input circuit 9-2 is connected to the power supply system for the inner circuit 8 at that time, it is necessary to change the interface standard because the input level changes. Also, if the input circuit 8 is connected to the power supply system of the output circuit 9-1, the input level changes with the switching noise of an output transistor, as shown in Japanese Laid Open Patent Disclosure (JP-A-Sho61-264747). Therefore, the influence of wiring resistance of the power supply wirings of the output circuit 9-1 of the interface circuit can be avoided by separating the power supply wiring of the input circuit 9-2 from the power supply wiring of the output circuit 9-1, and by sharing only the power supply terminal and ground terminal. Moreover, by classifying the terminals into terminals for the input circuit 9-2 and terminals for the output circuit 9-1 and by gathering on the case side, the influence of the impedance of bonding wires can be also decreased.

As explained above, according to the semiconductor device of the present invention, the circuits with a great rate to handle the periodic pulse signal are collected as the inner circuit 8 and separated from the power supply system of the interface circuit which includes load means for pulling up or down of the input terminal 6 and the output circuit 9-1 which includes driving means for driving the output terminal 5. As a result, the harmonic wave noise which is generated in the inner circuit 9-2 is not radiated from not only the output terminal 5 but also the input terminal 6 pulled up or down. Therefore, radiation can be limited to from the power supply system of the input circuit 9-2. Thus, there is an effect that the periodic harmonic wave high frequency electromagnetically radiated from the semiconductor device can be reduced.

What is claimed is:

1. A semiconductor device in which power is supplied from an external power supply system, comprising:

an input terminal;

an output terminal;

a first power supply system connected to first terminals of power supply and ground and a digital inner circuit, wherein said inner circuit includes a clock signal generating circuit, a driver for the clock signal, and circuits operating in response to the clock signal; and a second power supply system connected to second terminals of power supply and ground, said input terminal, said output terminal, and a digital interface circuit, wherein said second power supply system is independent of said first power supply system, and wherein said interface circuit includes a MOS transistor for pulling up or down said input terminal and an output circuit which includes a MOS transistor driving said output terminal, wherein said first power supply system is separated from said second power supply system, and said inner circuit is connected to said interface circuit through only signal lines.

2. A semiconductor device according to claim 1, further comprising low pass filters connected between said first terminals and said external power supply system.

3. A semiconductor device according to claim 1, further comprising an analog circuit connected to a third power supply system which is connected to said second power supply system.

4. A semiconductor device according to claim 3, wherein said analog circuit includes a circuit for inhibiting said inner circuit from driving said interface circuit during operation of said analog circuit.

5. A semiconductor device according to claim 3, further comprising low pass filters connected between said first terminals and said external power supply system.

6. A semiconductor device according to claim 1, wherein said second power supply system includes:

a fourth power supply system connected to said second terminals, said output circuit and said output terminal; and a fifth power supply system connected to said third power supply system, an input circuit and said input terminal.

7. A semiconductor device according to claim 6, wherein said MOS transistor for pulling up or down said input terminal is connected to said third power supply system.

8. A semiconductor device according to claim 6, further comprising low pass filters connected between said first terminals and said external power supply system.

9. A semiconductor device according to claim 6, further comprising an analog circuit connected to a third power supply system which is connected to said second power supply system.

10. A semiconductor device according to claim 9, wherein said analog circuit includes a circuit for inhibiting said inner circuit from driving said interface circuit during operation of said analog circuit.

11. A semiconductor device according to claim 1, further comprising electrostatic break down protecting elements disposed between said first power supply system power supply terminal and said second power supply system power supply terminal, between said first power supply system power supply terminal and said second power supply system ground terminal, between said first power supply system ground terminal and said second power supply system power supply terminal, and between said first power supply system ground terminal and said second power supply system ground terminal, respectively.

12. A semiconductor device according to claim 11, wherein further comprising electrostatic break down protecting elements between external power supply line and said input terminal, between external ground line and said input terminal, between external power supply line and said output terminal, between external ground line and said output terminal, respectively.

* * * * *

UNITED STATES PATENT AND TRADEMARK OFFICE
CERTIFICATE OF CORRECTION

PATENT NO.: 5,708,372
DATED: January 13, 1998
INVENTORS: Hatsuhide Igarashi, et al.

It is certified that error appears in the above-identified patent and that said Letters Patent is hereby corrected as shown below.

Title page, item [30], the Foreign Application Priority Data as follows: change "6-155824" to -- 7-155824 --.

Signed and Sealed this

Fourteenth Day of April, 1998

Attest:

BRUCE LEHMAN

Attesting Officer

Commissioner of Patents and Trademarks